United States Patent [19]

Nakamura et al.

[11] Patent Number: 5,147,470
[45] Date of Patent: Sep. 15, 1992

[54] HIGH STRENGTH LEAD FRAME MATERIAL AND METHOD OF PRODUCING THE SAME

[75] Inventors: Shuichi Nakamura, Yasugi; Hakaru Sasaki, Matsue; Rikizo Watanabe, Mooka, all of Japan

[73] Assignee: Hitachi Metals, Ltd., Tokyo, Japan

[21] Appl. No.: 671,379

[22] Filed: Mar. 7, 1991

[30] Foreign Application Priority Data

Dec. 25, 1990 [JP] Japan .................................. 2-413670

[51] Int. Cl.$^5$ ............................................ C22C 38/08
[52] U.S. Cl. .................... 148/677; 148/336; 148/442; 148/707; 420/95
[58] Field of Search ................. 148/12 R, 336; 420/95

[56] References Cited

U.S. PATENT DOCUMENTS 4,203,782  5/1980  Yamada et al. ...................... 148/336
5,026,435  6/1991  Nakamura et al. .................... 420/95

FOREIGN PATENT DOCUMENTS 55-128565  10/1980  Japan .
55-131155  10/1980  Japan .
 57-82455   5/1982  Japan .
59-198741  11/1984  Japan ...................................... 420/95
60-238446  11/1984  Japan ...................................... 420/95
 61-6251    1/1986  Japan .
 64-817     1/1989  Japan .
 1-15562    3/1989  Japan ..
64-61042    3/1989  Japan .

Primary Examiner—Deborah Yee
Attorney, Agent, or Firm—Finnegan, Henderson, Farabow, Garrett & Dunner

[57] ABSTRACT

A high strength lead frame material consists essentially, by weight, of 0.5 to 22% Co, 22 to 32.5% Ni, not more than 1.0% Mn and not more than 0.5% Si and the balance Fe and incidental impurities. The contents of Ni and Co are selected so that the Ni content is 27 to 32.5% when the Co content is less than 12%, and so that, when the Co content is not less than 12%, the Ni content and the Co content meet the condition of $66\% \leq 2Ni + Co \leq 74\%$. The material has a multi-phase structure formed of austenitic phase, martensitic phase, and ferritic phase, the austenitic phase occupying not less than 50% of the structure.

The method of producing the alloy of the invention comprises the steps of solid-solutioning the material of the above composition at a temperature not less than austenitizing completion temperature, cold-rolling the material at a rate of 40 6to 90% in reduction, and annealing the material at a temperature less than the austenitizing completion temperature.

15 Claims, 2 Drawing Sheets

HIGH STRENGTH LEAD FRAME MATERIAL AND METHOD OF PRODUCING THE SAME

BACKGROUND OF THE INVENTION

1. Field of the Invention

The present invention relates to a material of lead frames for semiconductor devices, having strength greater than those of known materials. The invention also is concerned with a method of producing this material.

2. Description of the Related Art

In recent years, semiconductor devices such as logics etc. are required to have greater capacities, higher degree of integration and thinner wall thickness regarding a package. Under this circumstance, there is a trend for a greater number of pins to be installed on lead frames of such semiconductor devices and for smaller wall thickness of the lead frames. This has given a rise to the demand for a lead frame material having a greater strength.

Hitherto, materials such as Fe-42Ni and Fe-29Ni-17Co (kovar) are known as materials for multi-pin ferrous-type lead frame. Various proposals have been made for improving properties of these known materials. For instance, Japanese Unexamined Patent Publication No. 55-131155 discloses a high-strength Fe-Ni type alloy containing various strengthening elements. Improved alloys of Fe-Ni-Co type are disclosed in Japanese unexamined Patent Publication Nos. 55-128565, 57-82455 and 61-6251, Japanese Examined Patent Publication Nos. 1-817 and 1-15562, and Japanese Unexamined Patent Publication No. 1-61042 of the same applicant as the present invention.

In most cases, a multi-pin lead frame is produced by photo-etching which is suitable for fine and delicate processing. Thin-walled multi-pin lead frames of Fe-42Ni or Fe-29Ni-17Co, produced through a delicate processing, tend to suffer from various problems. For instance, they are often apt to exhibit deformation such as warping, bending and so on during assembling of package, transportation and mounting, due to insufficient strength of the lead, as well as buckling due to shock during the use.

As mentioned before, various attempts and proposals have been made for improving Fe-Ni type alloys and Fe-Ni-Co type alloys. Namely, Japanese Unexamined Patent Publication No. 55-131155 proposes to improve strengths in Fe-Ni type alloys and Fe-Ni-Co type alloys by addition of Si, Mn and Cr. There are also various proposals for strengthening these alloys by addition of strengthening elements other than those mentioned above. It has also been proposed to control thermal expansion of Fe-Ni-Co type alloys as in, for example, Japanese Unexamined Patent Nos. 55-128565, 57-82455 and 61-6251, Japanese Examined Patent Publication Nos. 1-817 and 1-15562 and Japanese Unexamined Patent Publication No. 1-61042. The alloys strengthened by addition of strengthening elements, however, are liable to oxidize the surface of the lead frame, due to excessive amounts of strengthening elements besides the major elements, resulting in serious degradation in solderability and platability both of which are very essential factors for lead frames. Among the above-mentioned Patent Publications proposing control of thermal expansion of Fe-Ni-Co type alloys, only Japanese Unexamined Patent No. 55-128565 attempts to positively improve the strength of the lead frame. The art disclosed in this patent publication, however, employs a strengthening mechanism which is distinct from that of the material of the present invention.

SUMMARY OF THE INVENTION

The present inventors have been interested in Fe-Ni-Co alloys which have unstable austenitic phase at room temperatures, and have conducted experimental production of this type of alloy with various compositions and conditions. As a result, the present inventors have found that a lead frame with enhanced strength can be obtained without impairing properties of the lead frame, particularly solderability and platability, by using a material of a multi-phase structure comprising an austenitic phase of more than a predetermined ratio, a ferritic phase and/or a martensitic phase which structure is formed by a strain-induced martensitic transformation effected at a specific work ratio and then by a precipitation of inversely-transformed austenitic phase from the martensitic phase (i.e., austenitic phase occurring by the heating of the martensite which austenitic phase is brought about by the transformation of the deformation-induced martensitic phase having been transformed from an initial austenitic phase) which precipitation occurs by a subsequent annealing.

According to one aspect of the present invention, there is provided a high strength lead frame material consisting essentially, by weight, of 0.5 to 22% Co, 22 to 32.5% Ni, not more than 1.0% Mn and not more than 0.5% Si and the balance Fe and incidental impurities, the contents of Ni and Co being determined such that the Ni content is 27 to 32.5% when the Co content is less than 12%, whereas, when the Co content is not less than 12%, the total of both the Ni content and the Co content is $66\% \leq 2Ni+Co \leq 74\%$, the material also having a multi-phase structure formed of inverse-transformation austenitic phase (with or without residual austenitic phase), ferritic phase and/or martensitic phase, the austenitic phase occupying not less than 50% of the structure. Ni of 0.5 to 3% may be replaced by the same content of Cu. In addition to the constituents, elements bringing about solid solution strengthening or precipitaten hardening may be added. Further, B and/or Mg may be added to the material.

According to another aspect of the invention, there is provided a method of producing a lead frame material comprising the steps of: preparing an alloy having the above-mentioned composition; subjecting the alloy to a solid-solution treatment conducted at a temperature not lower than austenitizing completion temperature; subjecting the alloy to cold working at a ratio of 40 to 90% so as to transform a part of the austenitic phase into strain-induced martensitic phase; and subjecting the alloy to an annealing conducted at a temperature not higher than the austenitizing completion temperature so as to bring about precipitation of inverse-transformation austenitic phase so that a desired structure of multi-phases is obtained.

Thus, the most critical feature of the lead frame material of the present invention resides in that the strength is enhanced by the multi-phase structure having austenitic, ferrite and/or martensitic phases, without requiring much amount of strengthening elements which impair solderability and platability, in contrast to prior art Fe-Ni-Co alloys which are strengthened by addition of strengthening elements to a single-phase structure of austenite or martensite.

In the highly strengthened material of the invention, since the inverse-transformation from martensite to austenite is sensitive to temperature, there is a large degree of dependency on annealing temperature which causes somewhat problems with respect to a stable production of the material. The present inventors have found that solid solution strengthening or precipitation hardening can be used to reduce the dependency on annealing temperature so that the high strength of the material is achieved by the inverse transformation without degrading the solderability, platability and thermal expansion characteristics of the material. On the other hand, the material of the present invention is slightly inferior in hot work ability, however, the present inventors have found that, by adding a very slight amount of B and/or Mg, the hot workability can be enhanced without degrading other characteristics. Further, in the course of estimating the solderability and platability of the material, the present inventors have found that, by reducing to a predetermined level the amount of each of Mn and Si (both of which were added as deoxidizers and remained in the material) and the amount of each of C, S, O and N existing therein as impurities, the solderability and the platability are remarkably enhanced to thereby improve practical characteristics having been sought other than the properties of strength and thermal expansion.

Regarding the term "austenitic phase" used in the invention, an austenitic phase obtained after solution heat treatment is partially changed to martensitic phase by cold working because of strain-induced transformation, and other part of the austenitic phase remains without the transformation which remaining austenitic phase is called as "residual austenitic phase" in the specification. A part of the martensite is inverse-transformed to austenite by a final annealing, which inverse-transformed austenite is hardly distinguished from the residual austenite when being quantitatively measured by means of X-ray. Thus, in a case where there exist both inverse-transformed austenite and residual austenite in the material, both of the austenites are called as "austenitic phase", and the austenitic phase is made to be not less than 50% in the material of the invention.

The martensite is inverse-transformed to be austenite phase at the final annealing and at the same time there occurs ferrite. Also, the ferrite occurring at the time of the inverse-transformation together with the austenitic phase is hardly distinguished from the martensite.

According to the invention, the contents of the elements of the material are limited for the following reasons.

Co provides an effect to minimize thermal expansion coefficient when its content is in the vicinity of about 17 wt % or about 5 wt %. Thermal expansion coefficient becomes excessively large to impede thermal expansion compatibility with silicon chips, when the Co content is below 0.5 wt % or when it exceeds 22 wt %. For this reason, the Co content is selected to be 0.5 to 22 wt %.

The content of Ni is determined in relation to the Co content. The starting-temperature of the martensitic transformation becomes high and austenitic phase becomes unstable when Ni content is below 27 wt % in a case where the Co content is below 12 wt % or when the content of (2Ni+Co) is below 66 wt % in another case where the Co content is not less than 12 wt %. In such cases, the austenite becomes unstable and martensitic transformation is undesirably commenced in the course of cooling in the solid-solution treatment, resulting in insufficient austenite formation. On the other hand, when Ni content exceeds 32.5 wt % in case where C content is below 12 wt % or when the content of (2Ni+Co) exceeds 74 wt % in another case where Co content is not less than 12 wt %, the austenitic phase becomes too stable to bring about deformation-induced martensitic transformation. For these reasons, the Ni content is determined in relation to the Co content such that, when Co content is below 12 wt %, the Ni content is 27 to 32.5 wt %, whereas, when the Co content is not less than 12 wt %, the Ni content meets the condition of 66 wt % $\leq$ 2Ni+Co $\leq$ 74 wt %.

Cu is an element which improves resistance against corrosion occurring in a gap between the packaging resin and the lead frame. Appreciable crevice corrosion resistance cannot be obtained when the Cu content is below 0.5 wt %. On the other hands, when the Cu content exceeds 3 wt %, a brittle intermetallic compound of Cu and Sn occurs in the interface between the lead frame and solder, causing a greater tendency of separation of the solder. Cu also serves as an austenite stabilizer. When Cu is added in excess of 3 wt %, the austenitic phase becomes too stable to bring about strain-induced transformation. The Cu content, therefore, is selected to be 0.5 to 3 wt %.

Mn, which acts as a deoxidizer, undesirably increases thermal expansion coefficient and impairs solderability and platability when its content exceeds 1.0 wt %. For this reason, the Mn content is selected to be not more than 1.0 wt %.

Si is added as a deoxidizer and, hence, it is preferable that no Si remains in the material. Presence of Si up to 0.5 wt %, however, is allowable because such small Si content does not cause substantial increase in the thermal expansion coefficient and substantial degradation in the solderability and platability.

Next, the reasons for the limitation of the amount of solid solution strengthening elements and precipitation hardening elements are explained below.

Each of Nb, Ti, Zr, Mo, V, W and Be is important in such viewpoint that these elements act to strengthen the matrix of the alloy of the invention by solid solution strengthening or precipitation hardening. The alloy of the present invention is strengthened by the precipitation of inverse-transformation austenitic phase occurring at the final annealing, however, it is preferable to provide austenite of a large amount ratio in view of thermal expansion characteristic. Thus, it is necessary to make the final annealing temperature be raised as high as possible. On the other hand, as shown by a real line in FIG. 3, the mechanical properties of Fe-Ni-Co alloy are abruptly degraded as the annealing temperature is raised. Thus, it is desirable to reduce the dependency of mechanical property on annealing temperature so as to obtain production stability.

Figure 3:
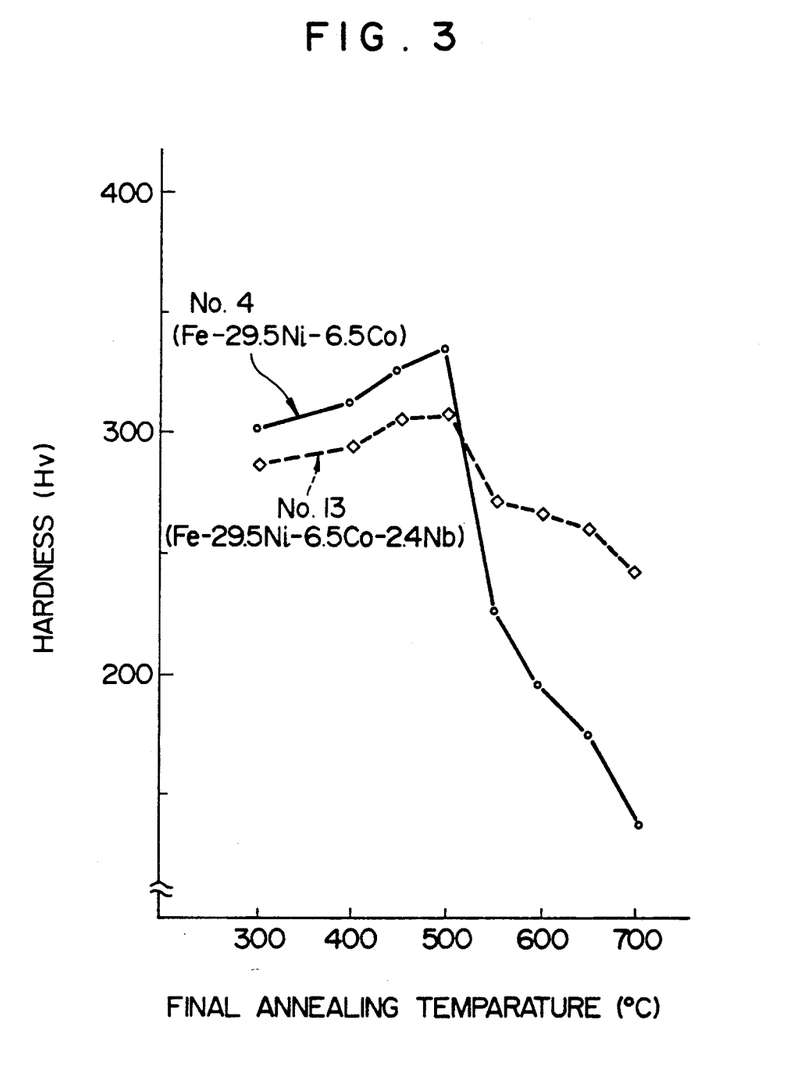
FIG. 3 is a graph showing the relationship between the content of Nb and the hardness of the material obtained after final annealing.

The present inventors have found that, by adding these solid solution strengthening element and/or precipitation hardening elements in the alloy, the dependency of mechanical property on annealing temperature is reduced as shown by dotted line in FIG. 3 and that the characteristics at the high temperature can be remarkably improved.

The addition of these strengthening elements less than 0.1% is not effective to obtain the production stability, while the addition of these strengthening elements more than 3% accelerates the oxidation of the surface of the alloy material with the result that the solderability and platability of the alloy material are extremely degraded. In addition, since these strengthening elements act to generate austenite, the excess amount of addition of these elements causes the austenite to become too stable to obtain the aimed multi-phase structure. Thus, the content of these strengthening elements is limited to be 0.1 to 3%.

B and Mg are added to improve the hot workability of the alloy. The addition of less than 0.0001% of B and/or Mg is not effective to improve the hot workability, while the content thereof more than 0.03% degrades the ductility of the alloy at the time of cold working and degrades the etchability of the alloy. Thus, the content of B and/or Mg is limited to 0.0001 to 0.03%.

Next, impurities are explained below.

C more than 0.02% degrades etching perforatability and deteriorates solderability and platability due to the excess precipitation of carbide. Thus, C is preferably limited to be not more than 0.02% in amount. More preferably, the amount of C is not more than 0.015%.

S more than 0.015% in amount forms excess amount of MnS which is apt to cause surface flaws on the alloy. Further, S in the state of a solid solution deteriorates the hot workability of the alloy. Thus, S is preferably limited to be not more than 0.015%. More preferably, S is limited to be less than 0.010%.

Oxygen more than 150 ppm forms excess amount of oxides by combining with both Si used as a deoxidizer and such elements of high affinity with oxygen as Al, Mg and etc., which excess amount of oxides degrades the surface cleanness of the alloy with the result that the solderability and platability thereof are deteriorated. Thus, oxygen included in the alloy is preferably limited to be not more than 150 ppm. More preferably, oxygen is limited to be not more than 100 ppm.

Nitrogen has a function of stabilizing austenite. Thus, N included in excess of 100 ppm causes austenite to be excessively stabilized to thereby make the strain-induced transformation hardly occur, which nitrogen also precipitates excess amount of nitrides with the result that the solderability and platability of the alloy are deteriorated. Thus, the amount of N is preferably limited to be not more than 500 ppm.

In the alloy of the invention, the final structure of the material is determined by residual austenitic phase in the solid-solution treatment, deformation-induced martensitic phase, inverse-transformation austenitic phase precipitated in the final annealing and ferritic phase generated during the inverse-transformation. However, with respect to both of the phase constitution of the inverse-transformation austenitic phase $\gamma''$ (partially including residual austenite $\gamma_R$) martensite $\alpha''$ (partially including ferrite $\alpha$), there are possible metallurgically the following various combinations:

(a) $\gamma''+\gamma_R+\alpha''+\alpha$—This combination occurs in a case where a decomposition, $\alpha''\rightarrow\gamma''+\alpha$, occurs when a part of $\alpha''$ is transformed into $\gamma''$ at the final annealing effected after a part of $\gamma_R$ had been transformed into $\alpha''$ by cold working;

(b) $\gamma''+\gamma_R+\alpha$—The combination occurs in another case where the composition, $\alpha''\rightarrow\gamma''+\alpha$, occurs at the final annealing with respect to all of $\alpha''$ which had been generated by transforming a part of $\gamma_R$ through cold working;

(c) $\gamma''+\alpha$—The combination occurs in still another case where all of $\gamma_R$ is transformed into $\alpha''$ by cold working and then all of the $\alpha''$ is decomposed into $(\gamma''+\alpha)$ at the final annealing; and (d) $\gamma''+\alpha''+\alpha$—The combination occurs in still another case where all of $\gamma_R$ is transformed into $\alpha''$ by cold working and then a part of $\alpha''$ is decomposed into $(\gamma''+\alpha)$ at the final annealing.

At any rate, in a case where the inverse-transformation austenite and/or residual austenite are less than 50% in amount, the material exhibits a too large thermal expansion coefficient to thereby impair the thermal expansion compatibility with silicon chips. When the ratio of austenite is 100%, the strength of the substrate is seriously reduced. Thus, the material of the invention has a multi-phase structure formed of austenitic phase including residual austenite and inverse-transformation austenite, ferrite and/or martensite, wherein the austenitic phase in total occupies at least 50% of the structure. The amount (%) of the austenitic phase is a value which is determined through an analysis of X-ray diffraction intensity explained below.

Referring now to the process of producing the material of the present invention, it is impossible to obtain a required amount of austenitic phase when the temperature of the solid-solution treatment before the cold work is not higher than the austenitizing completion temperature. Therefore, the solid-solution treatment should be conducted at a temperature not lower than the austenitizing completion temperature temperature. More preferably, the solid-solution treatment temperature is selected to be not higher than 950° C., in order to make crystal grains fine in size in a subsequent step.

The cold work ratio is selected to be 40 to 90 (%), because a value of this ratio below 40% cannot produce sufficient strain-induced martensitic transformation, whereas a value exceeding 90 wt % causes a too intensive anisotropy of the material.

When the temperature of the final annealing exceeds the austenitizing completion temperature, whole strain-induced martensitic phase is undesirably inverse-transformed to austenitic phase so that it becomes impossible to obtain a desired precipitation strengthening effect offered by the two-phase structure. The final annealing temperature, therefore, is selected to be below the austenitizing completion temperature.

Studies were made to find ranges of average thermal expansion coefficient between room temperature and 300° C. (represented by $\alpha_{R.T-300}$), hardness and tensile strength which are optimum for the assembling of package and the environment of use. As a result, it has been confirmed that a lead frame which ca be used practically well is obtained when the following conditions are met: $3\times10^{-6}\leq\alpha_{R.T-300})\leq9\times10^{-6}/°C.$, hardness (Hv)$\leq260$ and tensile strength$\leq80$ kgf/mm$^2$.

DESCRIPTION OF THE PREFERRED EMBODIMENTS

Examples of the material according to the present invention will be described.

Alloys shown in Table 1 were melted, cast, forged at a temperature of 1100° to 1150° C., and hot-rolled to a thickness of 3 mm. The rolled alloys were then subjected to a solid-solution treatment which has the steps of 1-hour heating at 1000° C. and a subsequent water cooling, and then to a cold rolling down to a thickness of 0.35 mm. The impurities, S, O and N, included in each of the alloy were not more than 0.015%, not more than 100 ppm and not more than 50 ppm, respectively, although these are not shown in Table 1.

These test samples of 0.35 mm thick were then subjected to a series of treatments including a solid-solution treatment at 750° C., cold rolling down to 0.1 mm (71% in reduction ratio) and final annealing at 650° C. Properties of the test samples after this series of process are shown in Table 12. A sample K' appearing in Table 2 is a sample which was obtained by finishing the test sample K of 0.35 mm thickness to the final thickness of 0.1 mm through a standard production process.

The amount or ratio (%) of the austenitic phase was determined from the following formula.

Ratio of austenitic phase (%)

$$\{I\gamma/(I\gamma+I\alpha)\} \times 100$$

$$I\gamma = I\gamma_{(111)} + I\gamma_{(200)} + I\gamma_{(220)} + I\gamma_{(311)} + I\gamma_{(222)}$$

where $I\gamma_{(111)}$ etc. show X-ray diffraction intensities of austenite $$I\alpha = I\alpha_{(110)} + I\alpha_{(200)} + I\alpha_{(211)}$$

where $I\alpha_{(110)}$ etc. show X-ray diffraction intensities of martensite/ferrite.

TABLE 1

| No. | C | Si | Mn | Ni | Co | Cu | 2 Ni + Co | Mg | B | others | Fe | Remark |
|---|---|---|---|---|---|---|---|---|---|---|---|---|
| 1 | 0.008 | 0.11 | 0.50 | 27.21 | 19.36 | | 73,.78 | | | | Bal | The present invention |
| 2 | 0.007 | 0.11 | 0.50 | 26.56 | 15.12 | | 68, 24 | | | | " | The present invention |
| 3 | 0.008 | 0.11 | 0.48 | 29.02 | 10.63 | | | | | | " | The present invention |
| 4 | 0.005 | 0.13 | 0.49 | 29.25 | 6.50 | | | | | | " | The present invention |
| 5 | 0.004 | 0.12 | 0.49 | 29.10 | 2.01 | | | | | | " | The present invention |
| 6 | 0.008 | 0.12 | 0.51 | 27.7 | 16.43 | | 62, 16 | | | | " | The present invention |
| 7 | 0.009 | 0.12 | 0.51 | 28.51 | 5.59 | | | | | | " | The present invention |
| 8 | 0.007 | 0.13 | 0.51 | 27.77 | 2.53 | | | | | | " | The present invention |
| 9 | 0.006 | 0.11 | 0.50 | 30.76 | 5.10 | | | | | | " | The present invention |
| 10 | 0.007 | 0.11 | 0.49 | 29.51 | 6.48 | — | | | 0.0011 | | " | The present invention |
| 11 | 0.008 | 0.12 | 0.50 | 29.40 | 6.55 | — | | 0.0026 | | | " | The present invention |
| 12 | 0.008 | 0.10 | 0.49 | 29.00 | 6.60 | — | | 0.0008 | 0.007 | | " | The present invention |
| 13 | 0.007 | 0.11 | 0.51 | 29.50 | 6.50 | — | | | | Nb 2.40 | " | The present invention |
| 14 | 0.008 | 0.12 | 0.50 | 29.80 | 7.51 | — | | | | Ti 1.50 | " | The present invention |
| 15 | 0.005 | 0.13 | 0.47 | 29.01 | 6.49 | — | | | | Zr 1.25 | " | The present invention |
| 16 | 0.004 | 0.13 | 0.47 | 29.13 | 6.55 | — | | | | Mo 2.00 | " | The present invention |
| 17 | 0.007 | 0.12 | 0.48 | 29.33 | 6.51 | — | | | | V 1.13 | " | The present invention |
| 18 | 0.009 | 0.11 | 0.49 | 29.20 | 6.53 | — | | | | W 1.60 | " | The present invention |
| 19 | 0.008 | 0.11 | 0.50 | 29.12 | 6.60 | — | | | | Be 0.91 | " | The present invention |
| 20 | 0.006 | 0.10 | 0.51 | 30.11 | 6.48 | — | | | | Nb 0.51 Ti 0.56 | " | The present invention |
| 21 | 0.007 | 0.11 | 0.50 | 30.23 | 6.48 | — | | | | Nb 0.73 Be 0.50 | " | The present invention |
| 22 | 0.008 | 0.10 | 0.50 | 30.08 | 6.61 | — | | | | Zra 90 Mo 0.77 | " | The present invention |
| 23 | 0.008 | 0.13 | 0.51 | 30.07 | 6.71 | — | | | | V 1.01 W 0.89 | " | The present invention |
| 24 | 0.009 | 0.12 | 0.52 | 29.48 | 6.53 | — | | | 0.0015 | Nb 0.96 | " | The present invention |
| 25 | 0.005 | 0.12 | 0.53 | 29.51 | 6.53 | — | | 0.0020 | | Nb 1.10 | " | The present invention |
| 26 | 0.005 | 0.12 | 0.49 | 29.55 | 6.50 | — | | 0.0019 | 0.0010 | Nb 0.72 | " | The present invention |
| 27 | 0.006 | 0.11 | 0.49 | 29.12 | 6.48 | 0.95 | — | | | Nb 0.97 | " | The present invention |
| 28 | 0.006 | 0.12 | 0.48 | 28.50 | 6.69 | 1.70 | — | | | Ti 1.67 | " | The present invention |
| 29 | 0.007 | 0.13 | 0.50 | 27.01 | 6.54 | 2.69 | — | | 0.0015 | Nb 0.99 | " | The present invention |

TABLE 1-continued

| No. | Chemical Composition (wt %) | | | | | | | | | | | Remark |
|---|---|---|---|---|---|---|---|---|---|---|---|---|
| | C | Si | Mn | Ni | Co | Cu | 2 Ni + Co | Mg | B | others | Fe | |
| 30 | 0.009 | 0.12 | 0.50 | 26.05 | 9.04 | | | 0.0021 | | | | Comparison Material |
| 31 | 0.008 | 0.11 | 0.52 | 28.88 | 16.89 | | 74.65 | | | | '' | Conventional Material |

TABLE 2

| | Amount of Austenite (%) | Hardness (Hv) | Tensile strength (Kgf/mm$^2$) | $a_{30-300}$ ($\times 10^{-6}$/°C.) | * Platability | ** Solderability | *** Crevice Corrosion Resistance (spot/cm) | Remarks |
|---|---|---|---|---|---|---|---|---|
| 1 | 77 | 385 | 120 | 8.9 | No swell | No separation | 9 | The present invention |
| 2 | 88 | 290 | 90 | 5.5 | '' | No separation | 8 | The present invention |
| 3 | 85 | 290 | 98 | 6.9 | '' | No separation | 8 | The present invention |
| 4 | 88 | 305 | 105 | 6.9 | '' | No separation | 8 | The present invention |
| 5 | 89 | 270 | 90 | 7.3 | '' | No separation | 9 | The present invention |
| 6 | 90 | 280 | 89 | 5.6 | '' | No separation | 1 | The present invention |
| 7 | 93 | 292 | 95 | 6.8 | '' | No separation | 1 | The present invention |
| 8 | 90 | 267 | 83 | 7.5 | '' | No separation | 2 | The present invention |
| 9 | 92 | 290 | 96 | 6.7 | '' | No separation | 9 | The present invention |
| 10 | 91 | 302 | 105 | 6.9 | '' | No separation | 7 | The present invention |
| 11 | 91 | 305 | 106 | 6.9 | '' | No separation | 8 | The present invention |
| 12 | 87 | 315 | 110 | 7.5 | '' | No separation | 8 | The present invention |
| 13 | 90 | 320 | 117 | 6.9 | '' | No separation | 8 | The present invention |
| 14 | 95 | 325 | 120 | 5.8 | '' | No separation | 7 | The present invention |
| 15 | 85 | 356 | 123 | 7.9 | '' | No separation | 9 | The present invention |
| 16 | 87 | 317 | 117 | 7.5 | '' | No separation | 9 | The present invention |
| 17 | 90 | 309 | 107 | 7.0 | '' | No separation | 10 | The present invention |
| 18 | 89 | 321 | 118 | 7.6 | '' | No separation | 11 | The present invention |
| 19 | 89 | 332 | 120 | 7.7 | '' | No separation | 9 | The present invention |
| 20 | 75 | 306 | 107 | 5.7 | '' | No separation | 8 | The present invention |
| 21 | 96 | 295 | 91 | 5.5 | '' | No separation | 8 | The present invention |
| 22 | 97 | 296 | 93 | 7.4 | '' | No separation | 9 | The present invention |
| 23 | 96 | 301 | 99 | 5.6 | '' | No separation | 9 | The present invention |
| 24 | 89 | 318 | 115 | 7.7 | '' | No separation | 7 | The present invention |
| 25 | 89 | 320 | 119 | 7.7 | '' | No separation | 10 | The present invention |
| 26 | 90 | 317 | 120 | 7.6 | '' | No separation | 9 | The present invention |
| 27 | 91 | 315 | 111 | 7.3 | '' | No separation | 1 | The present invention |
| 28 | 91 | 316 | 113 | 7.4 | '' | No separation | 1 | The present invention |
| 29 | 92 | 315 | 112 | 7.4 | '' | No separation | 2 | The present invention |
| 30 | 20 | 322 | 104 | 10.7 | '' | No separation | 8 | Comparison material |
| 31 | 100 | 217 | 61 | 4.5 | '' | No separation | 9 | conventional material |
| 32 | 100 | 210 | 67 | 4.8 | '' | No separation | 8 | conventional |

TABLE 2-continued

| Amount of Austenite (%) | Hardness (Hv) | Tensile strength (Kgf/mm²) | $\alpha_{30-300}$ ($\times 10^{-6}$/°C.) | Platability* | Solder-ability** | Crevice Corrosion Resistance (spot/cm)*** | Remarks |
|---|---|---|---|---|---|---|---|
| | | | | | aration | | material |

* Platability: After a series of treatments including degreasing with solvent, electrolytic degreasing and pickling, a strike plating was effected to form Cu plating of 0.5 μm thick followed by Ag plating of 3 μm. Plated samples were heated 5 minutes at 450° C. in atmospheric air. State of swell of plating layers was observed and evaluated.
** Solderability: A solder weather resistance test (1000 Hr preservation at 150° C. in atmospheric air followed by 90° bending) was conducted and state of separation at lead/solder interface was observed and evaluated.
*** Crevice-corrosion resistance: After dipping in 1% NaCl solution of 65° C., number of spots of corrosion at resin/lead frame interface was counted.

From Table 2, it is understood that all of the materials 1 to 29 according to the invention, which have multi-phase structure having both austenitic and martensitic/ferritic phases, exhibit superior mechanical properties as compared with the known materials 31 and 31' which have austenitic single-phase (austenite 100%) structures. A comparison material 30 exhibits superior mechanical properties but its thermal expansion coefficient undesirably exceeds $9 \times 10^{-6}$/° C. due to too small amount or ratio of austenite. Alloys No. 10 to 29 each containing a suitable amount of at least one element selected form the group of B and Mg or the group of Nb, Ti, Zr, Mo, V, W and Be as well as alloys No. 1 to 9 of the present invention are superior also in solderability and platability. In particular, samples No. 6 to 8 and No. 27 to 29 containing Cu exhibit high resistance to crevice corrosion, besides the high strength. Although not shown in Table 2, in each of the alloys containing at least one additive selected from the above-shown groups it was possible to improve hot workability and to reduce the dependency of strength on final annealing temperature.

Figure 1:
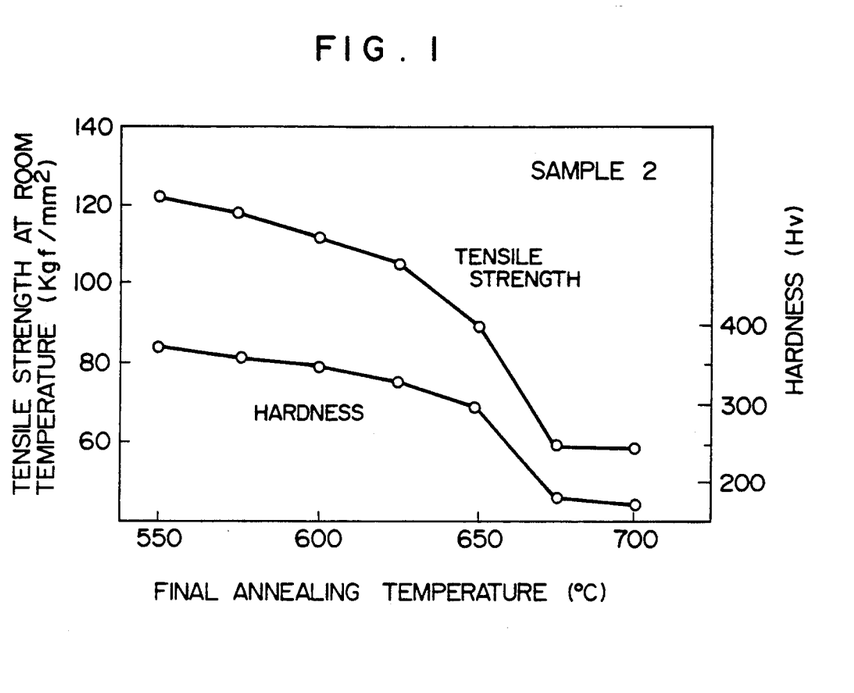
FIG. 1 is a graph showing the relationship between final annealing temperature and mechanical properties of a lead frame material according to the invention.
Figure 2:
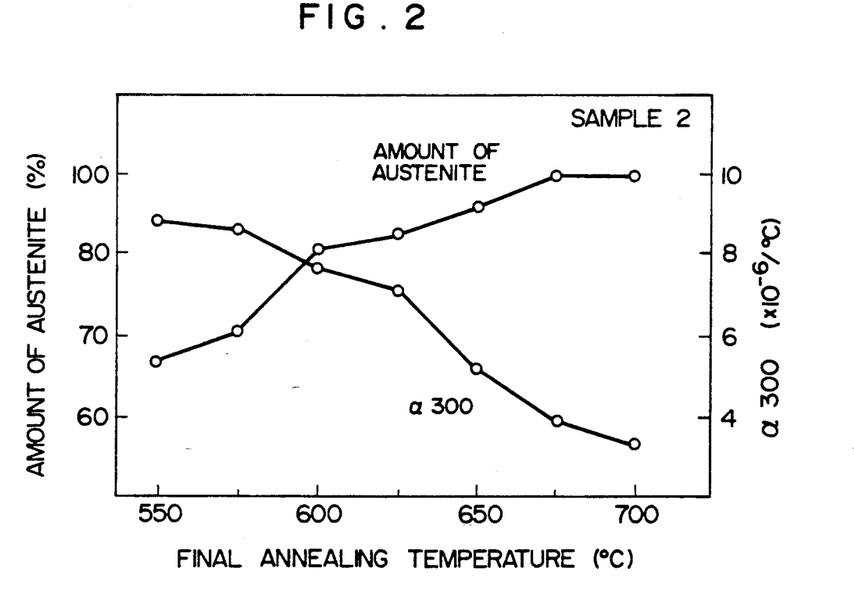
FIG. 2 is a graph showing the relationship between final annealing temperature, amount of austenite and average thermal expansion coefficient $\alpha_{R.T-300}$.

The relationship between mechanical properties and the final annealing temperature was examined in the test sample alloy B of the invention having the composition shown in Table 1, the results being shown in FIG. 1. FIG. 2 shows how the amount or ratio of austenitic phase varies according to the temperature of the final annealing as observed with the test sample alloy B. From FIG. 2, it is understood that the austenitizing completion temperature of this sample is not lower than 675°. When FIG. 1 is examined with this knowledge, it is understood that the test sample alloy B exhibits sufficiently high strength and hardness when the annealing temperature is below the austenitizing completion temperature but the strength and hardness are seriously impaired when the final annealing temperature exceeds the austenitizing completion temperature.

As will be seen from the foregoing description, the lead frame material of the invention has a specific composition of Fe-Ni-Co type alloy, and has a multi-phase structure realized by a combination of a strain-induced martensitic transformation in the final cold work and precipitation of inverse-transformation austenite caused in the final annealing. By the combination of these features, the present invention provides a material having mechanical properties required by current multi-pin type thin-walled lead frames, thus offering a great industrial advantage.

What is claimed is:

1. A high strength lead frame material consisting essentially, by weight, of 0.5 to 22% Co, 22 to 32.5% Ni, not more than 1.0% Mn and not more than 0.5% Si and the balance Fe and incidental impurities, the contents of Ni and Co being selected so that the Ni content is 27 to 32.5% when the Co content is less than 12%, and so that, when the Co content is not less than 12%, the Ni content and the Co content meet the condition of 66%≦2Ni+Co≦74%, said material also having structure comprising inverse-transformation austenitic phase, residual austenitic phase, and at least one phase selected from the group consisting of martensitic phase and ferritic phase, both of the austenitic phases occupying together not less than 50% of said structure.

2. A high strength lead frame material comprising the composition set forth in claim 1, said material having a structure comprising inverse-transformation austenitic phase, residual austenitic phase and ferritic phase.

3. A high strength lead frame material consisting essentially, by weight, of 0.5 to 22% Co, 22 to 32.5% Ni, not more than 1.0% Mn and not more than 0.5% Si and the balance Fe and incidental impurities, the contents of Ni and Co being selected so that the Ni content is 27 to 32.5% when the Co content is less than 12%, and so that, when the Co content is not less than 12%, the Ni content and the Co content meet the condition of 66%<2Ni+Co<74%, said material also having a structure comprising inverse-transformation austenitic phase and at least one phase selected from the group consisting of martensitic phase and ferritic phase, the inverse-transformation austenitic phase occupying not less than 50% of said structure.

4. A high strength lead frame material comprising the composition set forth in claim 3, said material having a structure comprising of inverse-transformation austenitic phase martensitic phase and ferritic phase.

5. A high strength lead frame material according to any one of claims 1 to 4, wherein 0.5 to 3% of Ni has been replaced by the same amount of Cu.

6. A high strength lead frame material according to any one of claims 1 to 4, wherein said material further contains at least one of 0.0001 to 0.03 wt % in total selected from the group consisting of B and Mg.

7. A high strength lead frame material consisting essentially, by weight, of: 0.5 to 22% Co; 22 to 32.5% Ni; not more than 1.0% Mn; not more than 0.5% Si; at least one kind of 0.1 to 3.0% in total selected from the group consisting of Nb, Ti, Zr, Mo, V, W and Be; and the balance Fe and incidental impurities, the content of Ni and Co being selected so that the Ni content is 27 to 32.5% when the Co content is less than 12%, and so that, when the Co content is not less than 12%, the Ni content and the Co content meet the condition of 66%≦2 Ni%+Co%≦74%, said material also having a structure comprising inverse-transformation austenitic phase, residual austenitic phase, at least one phase selected from the group consisting of martensitic phase and ferritic phase, both of said austenitic phases occupying not less than 50% of said structure.

8. A high strength lead frame material comprising the composition set forth in claim 7, said material having a structure comprising inverse-transformation austenitic phase, residual austenitic phase and ferritic phase.

9. A high strength lead frame material consisting essentially, by weight, of: 0.5 to 22% Co; 22 to 32.5% Ni; not more than 1.0% Mn; not more than 0.5% Si; at least one kind of 0.1 to 3.0% in total selected from the group consisting of Nb, Ti, Zr, Mo, V, W and Be; and the balance Fe and incidental impurities, the content of Ni and Co being selected so that the Ni content is 27 to 32.5% when the Co content is less than 12%, and so that, when the Co content is not less than 12%, the Ni content and the Co content meet the condition of 66%<2 Ni%+Co%<74%, said material having a structure comprising inverse-transformation austenitic phase and at least one phase selected from the group consisting of martensitic phase and ferritic phase, the inverse-transformation austenitic phase occupying not less than 50% of said structure.

10. A high strength lead frame material comprising the composition set forth in claim 9, said material having a structure comprising inverse-transformation austenitic phase, martensitic phase and ferritic phase.

11. A high strength lead frame material according to any one of claims 7 to 10, wherein 0.5 to 3% of Ni has been replaced by the same amount of Cu.

12. A high strength lead frame material according to any one of claims 7 to 10, wherein said material further contains at least one of 0.0001 to 0.03 wt % in total selected from the group consisting of B and Mg.

13. A high strength lead frame material according to any one of claims 1 and 3, having an average thermal expansion coefficient of $3 \times 10^{-6}/°C$. to $9 \times 10^{-6}/°C$. in a temperature range between a room temperature and 300° C., a hardness not smaller than 260 in terms of Hv and a strength not smaller than 80 kgf/mm$^2$.

14. A method of producing a lead frame material as set forth in any one of claims 1 to 10, comprising the steps of: subjecting said alloy to a solid-solution treatment conducted at a temperature not lower than austenitizing completion temperature; subjecting said alloy to a cold working at a ratio of 40 to 90% to transform a part of the austenitic phase into strain-induced martensitic phase; and subjecting said alloy to an annealing conducted at a temperature not higher than the austenitizing completion temperature to being about precipitation of inverse-transformation austenitic phase so that said material has a structure formed of inverse-transformation austenitic phase, and at least one phase selected from the group consisting of ferritic phase and martensitic phase.

15. The method of producing a lead frame material as in claim 14, wherein said material structure also contains residual austenitic phase.

* * * * *

UNITED STATES PATENT AND TRADEMARK OFFICE
CERTIFICATE OF CORRECTION

PATENT NO. : 5,147,470
DATED : September 15, 1992
INVENTOR(S) : Shuichi Nakamura et al.

It is certified that error appears in the above-identified patent and that said Letters Patent is hereby corrected as shown below:

Claim 3, col. 12, line 36, "<" should be --$\leq$-- (both occurrences).

Claim 4, col. 12, line 45, after "phase" (first occurrence), insert --,--.

Claim 9, col. 13, line 16, "<" should be --$\leq$-- (both occurrences).

Signed and Sealed this

Twenty-first Day of September, 1993

*Attest:*

BRUCE LEHMAN

*Attesting Officer*     *Commissioner of Patents and Trademarks*